US010557062B2

(12) United States Patent
Ujiiye et al.

(10) Patent No.: US 10,557,062 B2
(45) Date of Patent: Feb. 11, 2020

(54) COMPOSITION FOR FORMING ADHESIVE LAYER, ADHESIVE LAYER, MANUFACTURING METHOD FOR ADHESIVE LAYER, COMPOSITE MATERIAL, SHEET, HEAT DISSIPATION MEMBER, ELECTRONIC DEVICE, BATTERY, CAPACITOR, AUTOMOBILE COMPONENT AND MACHINE MECHANISM COMPONENT

(71) Applicant: JNC CORPORATION, Tokyo (JP)

(72) Inventors: Kento Ujiiye, Ichihara (JP); Takeshi Fujiwara, Ichihara (JP)

(73) Assignee: JNC CORPORATION, Tokyo (JP)

( * ) Notice: Subject to any disclaimer, the term of this patent is extended or adjusted under 35 U.S.C. 154(b) by 183 days.

(21) Appl. No.: 15/543,238

(22) PCT Filed: Jan. 13, 2016

(86) PCT No.: PCT/JP2016/050872
§ 371 (c)(1),
(2) Date: Aug. 10, 2017

(87) PCT Pub. No.: WO2016/114317
PCT Pub. Date: Jul. 21, 2016

(65) Prior Publication Data
US 2018/0002580 A1 Jan. 4, 2018

(30) Foreign Application Priority Data
Jan. 16, 2015 (JP) .................. 2015-007186

(51) Int. Cl.
*C09J 129/14* (2006.01)
*H01G 11/18* (2013.01)
*H01G 11/78* (2013.01)
*H01M 4/583* (2010.01)
*B32B 7/12* (2006.01)
*C09J 11/06* (2006.01)
*B32B 27/30* (2006.01)
*H01L 23/373* (2006.01)
*H01L 23/36* (2006.01)
*C09J 201/06* (2006.01)
*H01G 11/06* (2013.01)
*H01G 11/10* (2013.01)

(52) U.S. Cl.
CPC .............. *C09J 129/14* (2013.01); *B32B 7/12* (2013.01); *B32B 27/30* (2013.01); *C09J 11/06* (2013.01); *C09J 201/06* (2013.01); *H01G 11/18* (2013.01); *H01G 11/78* (2013.01); *H01L 23/36* (2013.01); *H01L 23/3735* (2013.01); *H01M 4/583* (2013.01); *B32B 2457/10* (2013.01); *B32B 2457/16* (2013.01); *B32B 2605/08* (2013.01); *H01G 11/06* (2013.01); *H01G 11/10* (2013.01)

(58) Field of Classification Search
CPC ........ C09J 129/14; C09J 11/06; C09J 201/06; B32B 7/12; B32B 27/30; H01G 11/18; H01G 11/78; H01L 23/3735; H01L 23/36; H01M 4/583
See application file for complete search history.

(56) References Cited

U.S. PATENT DOCUMENTS

| 5,618,896 A | 4/1997 | Ezzell et al. | |
|---|---|---|---|
| 2004/0219306 A1 | 11/2004 | Wang et al. | |
| 2007/0036919 A1 | 2/2007 | Wang et al. | |
| 2008/0035268 A1* | 2/2008 | Duarte | D06Q 1/10 156/241 |
| 2010/0033803 A1 | 2/2010 | Wang et al. | |
| 2012/0177932 A1 | 7/2012 | Masuda et al. | |
| 2012/0189831 A1 | 7/2012 | Kawasaki et al. | |
| 2013/0065063 A1 | 3/2013 | Masuda et al. | |
| 2014/0000711 A1 | 1/2014 | Akasaki et al. | |
| 2014/0242305 A1* | 8/2014 | Muraki | B32B 27/30 428/32.67 |
| 2016/0266422 A1 | 9/2016 | Zhang et al. | |

FOREIGN PATENT DOCUMENTS

| CN | 1517773 | 8/2004 |
|---|---|---|
| CN | 102497987 | 6/2012 |
| CN | 102548762 | 7/2012 |
| CN | 102859716 | 1/2013 |
| CN | 103467912 | 12/2013 |
| EP | 2347898 | * 7/2011 |
| JP | S61-275117 | 12/1986 |
| JP | H05-048265 | 2/1993 |
| JP | H11-021117 | 1/1999 |
| JP | H11-296089 | 10/1999 |
| JP | 2009-298833 | 12/2009 |
| JP | 2010-202862 | 9/2010 |
| JP | 2012-136022 | 7/2012 |
| JP | 2012-197435 | 10/2012 |
| TW | 201328882 | * 7/2013 |
| WO | 9530703 | 11/1995 |

OTHER PUBLICATIONS

Lawarence W. McKeen, subchapter 9.8 Polyvinyl Butyral, Chapter 9 Polyolefins, Polyvinyls and Acrylics, Permeability of Properties of Plastics and Elastomers, Fourth Edition. (Year: 2017).*

(Continued)

Primary Examiner — Jayne L Mershon
(74) Attorney, Agent, or Firm — JCIPRNET

(57) ABSTRACT

The invention relates to a composition for forming an adhesive layer, an adhesive layer, a manufacturing method for the adhesive layer, a composite material, a sheet, a heat dissipation member, an electronic device, a battery, a capacitor, an automobile component and a machine mechanism component, and the composition for forming the adhesive layer contains a polyvinyl acetal resin and a compound having an oxazoline group.

17 Claims, No Drawings

(56) References Cited

OTHER PUBLICATIONS

"Office Action of China Counterpart Application," with machine English translation thereof, dated Sep. 27, 2018, p. 1-p. 12.
"International Search Report (Form PCT/ISA/210) of PCT/JP2016/050872", dated Apr. 19, 2016, with English translation thereof, pp. 1-3.
"Search Report of Europe Counterpart Application", dated Jul. 12, 2018, p. 1-p. 6.
"Office Action of China Counterpart Application", dated Apr. 29, 2019, with English translation thereof, p. 1-p. 13.
"Office Action of Taiwan Counterpart Application," dated May 31, 2019, p. 1-p. 7.
"Office Action of China Counterpart Application", dated Aug. 8, 2019, with English translation thereof, pp. 1-12.

\* cited by examiner

COMPOSITION FOR FORMING ADHESIVE LAYER, ADHESIVE LAYER, MANUFACTURING METHOD FOR ADHESIVE LAYER, COMPOSITE MATERIAL, SHEET, HEAT DISSIPATION MEMBER, ELECTRONIC DEVICE, BATTERY, CAPACITOR, AUTOMOBILE COMPONENT AND MACHINE MECHANISM COMPONENT

CROSS-REFERENCE TO RELATED APPLICATION

This application is a 371 application of International PCT application serial no. PCT/JP2016/050872, filed on Jan. 13, 2016, which claims the priority benefit of Japan application no. 2015-007186, filed on Jan. 16, 2015. The entirety of each of the abovementioned patent applications is hereby incorporated by reference herein and made a part of this specification.

TECHNICAL FIELD

The invention relates to a composition for forming an adhesive layer, an adhesive layer, a manufacturing method for the adhesive layer, a composite material, a sheet, a heat dissipation member, an electronic device, a battery, a capacitor, an automobile component and a machine mechanism component.

BACKGROUND ART

With regard to members used in various apparatuses in recent years, a quantity of heat generation has increased in association with achievement of high performance and high function, and therefore use of a heat conductor being further excellent in heat dissipation characteristics is required for the apparatuses.

As such a heat conductor, an art of using a laminate in which a graphite sheet and a metal plate are adhered with an adhesive layer formed of a composition containing a polyvinyl acetal resin is disclosed (Patent literature No. 1).

CITATION LIST

Patent Literature

Patent literature No. 1: JP 2012-136022 A

SUMMARY OF INVENTION

Technical Problem

In recent years, a heat dissipation member containing an adhesive layer has come to be used also in a member in which heat is generated at a high temperature, such as an LED (Light Emitting Diode) illumination equipment and an IGBT (Insulated Gate Bipolar Transistor), and the adhesive layer has been required to have sufficient adhesive properties even under a high temperature of 120° C. or higher, and preferably about 150° C.

However, in a conventionally known adhesive layer used for the heat dissipation member, a heat-resistant temperature of 100° C. or lower is presumed for the purpose of heat dissipation in a semiconductor device (IC chip for a CPU, a memory or the like) using a silicon semiconductor, or the like, and the conventionally known adhesive layer used for the heat dissipation member has had room for improvement in view of adhesive properties under the high temperature.

The invention has been made in view of such a problem, and an objective of the invention is to provide a composition having capability of forming an adhesive layer excellent in adhesive properties with an adherend even under a high temperature (about 120° C.).

Solution to Problem

The present inventors have diligently continued to conduct study in order to solve the problem. As a result, the present inventors have found that the problem can be solved by a composition containing a polyvinyl acetal resin and a compound having an oxazoline group, and have completed the invention.

The invention includes examples of constitutional items described below.

Item 1. A composition for forming an adhesive layer, including a polyvinyl acetal resin and a compound having an oxazoline group.

Item 2. The composition according to item 1, wherein the polyvinyl acetal resin includes constitutional units A, B and C:

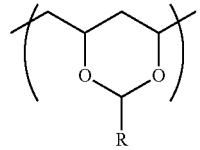

Constitutional unit A (wherein, in constitutional unit A, R is independently hydrogen or alkyl);

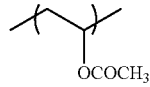

Constitutional unit B

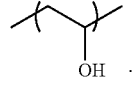

Constitutional unit C

Item 3. The composition according to item 2, wherein the polyvinyl acetal resin further includes constitutional unit D:

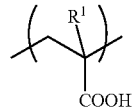

Constitutional unit D (wherein, in constitutional unit D, $R^1$ is independently hydrogen or alkyl having 1 to 5 carbons.).

Item 4. The composition according to item 2 or 3, wherein R in constitutional unit A is hydrogen or alkyl having 1 to 3 carbons.

Item 5. The composition according to any one of items 1 to 4, containing 0.02 to 1 part by mass of the compound having the oxazoline group based on 1 part by mass of the polyvinyl acetal resin.

Item 6. An adhesive layer, obtained by using a polyvinyl acetal resin and a compound having an oxazoline group.

Item 7. An adhesive layer, obtained by using the composition according to any one of items 1 to 5.

Item 8. A manufacturing method for the adhesive layer according to item 6 or 7, including steps (1) and (2) below:
step (1): a step of forming a layer including a polyvinyl acetal resin and a compound having an oxazoline group; and
step (2): a step of heating the layer obtained in step (1)

Item 9. A composite material, formed by adhering, to each other, one kind of carbon material selected from the group of a graphite sheet, a carbon fiber, a carbon nanotube and diamond, or at least two kinds of carbon materials selected from the group, through the adhesive layer according to item 6 or 7.

Item 10. A sheet, formed by adhering at least one kind of carbon material selected from the group of a graphite sheet, a carbon fiber, a carbon nanotube and diamond to a metal sheet through the adhesive layer according to item 6 or 7.

Item 11. A heat dissipation member, containing at least one selected from the composite material according to item 9 and the sheet according to item 10.

Item 12. An electronic device, including at least one selected from the composite material according to item 9, the sheet according to item 10 and the heat dissipation member according to item 11.

Item 13. A battery, including at least one selected from the composite material according to item 9, the sheet according to item 10 and the heat dissipation member according to item 11.

Item 14. A capacitor, including at least one selected from the composite material according to item 9, the sheet according to item 10 and the heat dissipation member according to item 11.

Item 15. An automobile component, including at least one selected from the composite material according to item 9, the sheet according to item 10 and the heat dissipation member according to item 11.

Item 16. A machine mechanism component, including at least one selected from the composite material according to item 9, the sheet according to item 10 and the heat dissipation member according to item 11.

Advantageous Effects of Invention

The present invention can provide a composition having capability of forming an adhesive layer excellent in adhesive properties with an adherend, particularly, a metallic material such as a metal sheet and a carbon material such as a graphite sheet even under a high temperature, specifically, a temperature of about 120° C. or higher.

Moreover, the present invention can form, even if a thickness of the adhesive layer is small, the adhesive layer excellent in the adhesive properties with the adherend, particularly, the metallic material such as the metal sheet, or the carbon material such as the graphite sheet, and therefore can provide a heat dissipation member, and further an electronic device, a battery, a capacitor, an automobile component and a machine mechanism component that are excellent in heat resistance, durability and heat dissipation characteristics, and can achieve weight reduction and size reduction.

Accordingly, the composition according to the present invention has an effect significantly superior to a conventional composition, and has a synergistic effect over an additive effect between a polyvinyl acetal resin and a compound having an oxazoline group.

DESCRIPTION OF EMBODIMENTS

Composition for Forming an Adhesive Layer

A composition for forming an adhesive layer according to the invention (hereinafter, also referred to merely as "composition according to the invention") contains a polyvinyl acetal resin and a compound having an oxazoline group.

The composition according to the invention has the effect as described above, and therefore can also be referred to as an adhesive.

The composition according to the invention may be a one-component type (one-part type) composition containing the polyvinyl acetal resin and the compound having the oxazoline group, or may be a two-component type (two-part type) composition including a component containing the polyvinyl acetal resin and a component containing the compound having the oxazoline group.

Whether the one-component type or the two-component type is applied only needs be appropriately selected according to desired requirements or the like. For example, the one-component type may be applied in order to easily form the adhesive layer, or the two-component type may be applied in consideration of storage stability or the like.

Polyvinyl Acetal Resin

The polyvinyl acetal resin is not particularly limited, but is preferably a resin including constitutional units A, B and C in view of capability of obtaining the adhesive layer excellent in toughness, heat resistance and impact resistance, and excellent in adhesive properties with an adherend, particularly, a metallic material such as a metal sheet or a carbon material such as a graphite sheet.

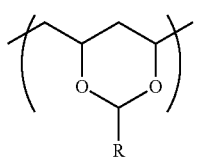

Constitutional unit A

Constitutional unit A is a constitutional unit having an acetal moiety, and can be formed by a reaction between a vinyl alcohol unit and aldehyde (R—CHO), for example.

R in constitutional unit A is independently hydrogen or alkyl. If the R is a bulky group (for example, a hydrocarbon group having a large number of carbons), a softening point of the polyvinyl acetal resin may be reduced. Moreover, the polyvinyl acetal resin in which the R is the bulky group has high solubility in a solvent, but on the other hand, is poor in chemical resistance in several cases. Thus, the R is preferably hydrogen or alkyl having 1 to 5 carbons, and further preferably hydrogen or alkyl having 1 to 3 carbons in view of the toughness or the like of the adhesive layer obtained, and further preferably hydrogen or propyl, and particularly preferably hydrogen in view of the heat resistance or the like.

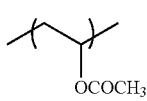

Constitutional unit B

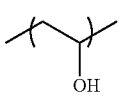

Constitutional unit C

The polyvinyl acetal resin preferably includes constitutional unit D in addition to constitutional units A to C, in view of capability of obtaining the adhesive layer excellent in the heat resistance, and the adhesive properties with the metallic material such as the metal sheet or the carbon material such as the graphite sheet under the high temperature.

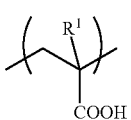

Constitutional unit D

In constitutional D, $R^1$ is independently hydrogen or alkyl having 1 to 5 carbons, preferably hydrogen or alkyl having 1 to 3 carbons, and further preferably hydrogen.

A total content of constitutional units A, B, C and D in the polyvinyl acetal resin is preferably 80 to 100 mol % based on a total constitutional unit of the resin. Specific examples of other constitutional units that may be contained in the polyvinyl acetal resin include a vinyl acetal chain unit other than constitutional unit A (constitutional unit in which R in constitutional unit A is other than hydrogen or alkyl), an intermolecular acetal unit described below, and a hemiacetal unit described below. A content of the vinyl acetal chain unit other than constitutional unit A is preferably less than 5 mol % based on a total constitutional unit of the polyvinyl acetal resin.

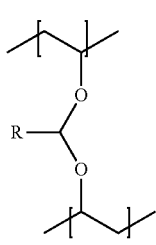

Intermolecular acetal unit (In which, R in the intermolecular acetal is defined in a manner identical with the definition of R in constitutional unit A.).

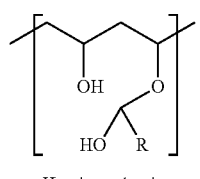

Hemiacetal unit (In which, R in the hemiacetal unit is defined in a manner identical with the definition of R in constitutional unit A.).

In the polyvinyl acetal resin, constitutional units A to D may be arranged with regularity (a block copolymer, an alternating copolymer or the like), or may be arranged at random (a random copolymer), but are preferably arranged at random.

Each constitutional unit in the polyvinyl acetal resin is preferably 49.9 to 80 mol % in a content of constitutional unit A, 0.1 to 49.9 mol % in a content of constitutional unit B, 0.1 to 49.9 mol % in a content of constitutional unit C, and 0 to 49.9 mol % in a content of constitutional unit, based on a total constitutional unit of the resin. Each constitutional unit is further preferably 49.9 to 80 mol % in a content of constitutional unit A, 1 to 30 mol % in a content of constitutional unit B, 1 to 30 mol % in a content of constitutional unit C, and 1 to 30 mol % in a content of constitutional unit D, based on the total constitutional unit of the resin.

In view of obtaining the polyvinyl acetal resin excellent in the chemical resistance, flexibility, wear resistance and mechanical strength, or the like, the content of constitutional unit A is preferably 49.9 mol % or more.

If the content of constitutional unit B is 0.1 mol % or more, the solubility of the polyvinyl acetal resin in the solvent is improved, and therefore such a case is preferred. Moreover, if the content of constitutional unit B is 49.9 mol % or less, the chemical resistance, the flexibility, the wear resistance and the mechanical strength are hard to reduce, and therefore such a case is preferred.

With regard to constitutional unit C, in view of the solubility of the polyvinyl acetal resin in the solvent, and the adhesive properties with the metallic material such as the metal sheet or the carbon material such as the graphite sheet in the adhesive layer obtained, a content thereof is preferably 49.9 mol % or less. Moreover, upon acetalizing a polyvinyl acetal chain in manufacture of the polyvinyl acetal resin, constitutional unit B and constitutional C are kept in an equilibrium relation, and therefore the content of constitutional unit C is preferably 0.1 mol % or more.

In view of capability of obtaining the adhesive layer excellent in the adhesive properties with the metallic material such as the metal sheet or the carbon material such as the graphite sheet, the content of constitutional unit D is preferably in the range described above.

Each content of constitutional units A to C in the polyvinyl acetal resin can be measured in accordance with JIS K 6728 or JIS K 6729.

The content of constitutional unit D in the polyvinyl acetal resin can be measured by a method described below.

In an aqueous solution of 1 mol/L sodium hydroxide, a polyvinyl acetal resin is warmed at 80° C. for 2 hours. Sodium is added to a carboxyl group by the above operation, and a polymer having —COONa is obtained. Excessive sodium hydroxide is extracted from the polymer, and then the resulting polymer is subjected to dehydration drying. Then, the resulting material is carbonized, and the resulting material is subjected to atomic absorption spectrometry to determine an amount of addition of sodium, and the content is quantitatively determined.

In addition, upon analyzing the content of constitutional unit B (vinyl acetate chain), constitutional unit D is quantitatively determined as a vinyl acetate chain. Therefore, the content of constitutional unit B is corrected by subtracting a quantitatively determined content of constitutional unit D from the content of constitutional unit B measured in accordance with JIS K 6728 or JIS K 6729.

A weight average molecular weight of the polyvinyl acetal resin is preferably 5000 to 300,000, and further preferably 10,000 to 150,000. If the polyvinyl acetal resin having the weight average molecular weight in the range described above is used, the adhesive layer, a composite material, a sheet and a heat dissipation member according to the invention can be easily manufactured, and therefore such a case is preferred.

In the invention, the weight average molecular weight of the polyvinyl acetal resin can be measured by gel permeation chromatography (GPC). Specific measuring conditions are as described below.

Detector: 830-RI (made by JASCO Corporation)
Oven: NFL-700M made by Nishio Company
Separation column: Shodex KF-805L×2
Pump: PU-980 (made by JASCO Corporation)
Temperature: 30° C.
Carrier: Tetrahydrofuran
Standard sample: Polystyrene Ostwald viscosity of the polyvinyl acetal resin is preferably 1 to 100 mPa·s. If the polyvinyl acetal resin having the Ostwald viscosity in the range described above is used, the adhesive layer, the composite material, the sheet and the heat dissipation member according to the invention can be easily manufactured, and the composite material, the sheet and the heat dissipation member according to the invention excellent in the toughness can be obtained, and therefore such a case is preferred.

The Ostwald viscosity can be measured by using a solution obtained by dissolving 5 g of the polyvinyl acetal resin in 100 milliliters of dichloroethane, and using an Ostwald-Cannon Fenske Viscometer at 20° C.

Specific examples of the polyvinyl acetal resin include polyvinyl butyral, polyvinyl formal, polyvinyl acetoacetal and a derivative thereof, and polyvinyl formal is preferred in view of capability of obtaining the adhesive layer excellent in the adhesive properties with the adherend, particularly, the metallic material such as the metal sheet or the carbon material such as the graphite sheet, and the heat resistance.

The polyvinyl acetal resin may be obtained by synthesis thereof or may be a commercial item.

A synthesis method for the resin including constitutional units A, B and C is not particularly limited, but specific examples thereof include the method described in JP 2009-298833 A. Moreover, a synthesis method for the resin including constitutional units A, B, C and D is not particularly limited, but specific examples thereof include the method described in JP 2010-202862 A.

Specific examples of the commercial item of the polyvinyl acetal resin include VINYLEC C and VINYLEC K (tradename; made by JNC Corporation) as polyvinyl formal, and specific examples thereof include DENKA BUTYRAL 3000-K (tradename; made by Denka Company Limited) as polyvinyl butyral.

As the polyvinyl acetal resin, the resin may be used alone, or two or more kinds of resins different in a kind, an order of bonds, the number of bonds or the like of the constitutional units may be used.

Compound Having an Oxazoline Group

The compound having the oxazoline group (hereinafter, also referred to as "oxazoline compound") is not particularly limited as long as the compound has the oxazoline group, and may be a low-molecular-weight compound or a polymer, but a polymer having the oxazoline group is preferred in view of capability of obtaining the adhesive layer excellent in the adhesive properties with the adherend.

The adhesive layer excellent in the adhesive properties with the adherend, particularly, the metallic material such as the metal sheet or the carbon material such as the graphite sheet under the high temperature is obtained by using such an oxazoline compound together with the polyvinyl acetal resin, and further the adhesive layer excellent in the heat resistance tends to be able to be obtained.

The adhesive layer is provided between or among two or more members, and therefore if a by-product is produced in such an adhesive layer, the by-product is ordinarily unable to be eliminated to an outside. In the above case, if a high temperature of 100° C. or higher is applied to the adhesive layer in which the by-product is produced, the adhesive properties of the adhesive layer may be reduced or a shape of the adhesive layer may change.

However, even if the oxazoline compound reacts with the polyvinyl acetal resin, the by-product such as water by the reaction tends to be hard to produce, and therefore the adhesive layer that is difficult in reducing the adhesive properties and is excellent in the heat resistance even under the high temperature can be obtained by using the compound. Meanwhile, in an epoxy compound or the like, the by-product such as water tends to be produced by the reaction, and therefore such a compound is not preferably used in the invention.

Specific examples of the low-molecular-weight compound having the oxazoline group include: a compound having one oxazoline group in a molecule, such as 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline, 2-isopropenyl-5-methyl-2-oxazoline and 2-isopropenyl-5-ethyl-2-oxazoline; and a compound having two or more oxazoline groups in a molecule, such as 2'2-bis(2-oxazoline), 2,2'-methylenebis(2-oxazoline), 2,2'-ethylenebis(2-oxazoline), 2,2'-trimethylenebis(2-oxazoline), 2,2'-tetramethylenebis(2-oxazoline), 2,2'-hexamethylenebis(2-oxazoline), 2,2'-octamethylenebis(2-oxazoline), 2,2'-ethylenebis(4,4'-dimethyl-2-oxazoline), 2,2'-p-phenylenebis(2-oxazoline), 2,2'-m-phenylenebis(2-oxazoline), 2,2'-m-phenylenebis(4,4'-dimethyl-2-oxazoline), 2,2'-(1,3-phenylene)bis(2-oxazoline), bis(2-oxazolinylcyclohexane)sulfide and bis(2-oxazolinylnorbornane)sulfide. Among the above compounds, a compound having two or more oxazoline groups in the molecule is preferred.

Specific examples of the polymer having the oxazoline group include a polymer obtained by using a monomer having an oxazoline group. The polymer may be a polymer of the monomer having the oxazoline group, or may be a copolymer obtained by polymerizing the monomer with other monomers copolymerizable with the monomer.

The monomer may be used alone, or with two or more kinds thereof.

Specific examples of the monomer having the oxazoline group include compounds similar to the compounds exemplified as the low-molecular-weight compound having the oxazoline group, and among the above compounds, a compound having one oxazoline group in a molecule is preferred.

Specific examples of other monomers copolymerizable with the monomer having the oxazoline group include: (meth)acrylic acid ester such as methyl (meth)acrylate, ethyl (meth)acrylate, n-butyl (meth)acrylate, isobutyl (meth)acrylate, t-butyl (meth)acrylate, cyclohexyl (meth)acrylate, 2-ethylhexyl (meth)acrylate, methoxypolyethyleneglycol (meth)acrylate, lauryl (meth)acrylate, stearyl (meth)acrylate, 2-hydroxyethyl (meth)acrylate, 2-hydroxypropyl (meth)acrylate, a monoesterified product of (meth)acrylic acid and polyethyleneglycol, 2-aminoethyl (meth)acrylate and a salt thereof, a caprolactone-modified product of (meth) acrylic acid, 2,2,6,6-tetramethylpiperidine (meth)acrylate and 1,2,2,6,6-pentamethylpiperidine (meth)acrylate; (meth) acrylate such as sodium (meth)acrylate, potassium (meth) acrylate and ammonium (meth)acrylate; unsaturated nitrile such as acrylonitrile and methacrylonitrile; unsaturated amide such as (meth)acrylamide, N-methylol (meth)acrylamide and N-(2-hydroxyethyl) (meth)acrylamide; vinyl ester such as vinyl acetate and vinyl propionate; vinyl ethers such as methyl vinyl ether and ethyl vinyl ether; α-olefin such as ethylene and propylene; halogen-containing α,β-unsaturated aliphatic hydrocarbon such as vinyl chloride, vinylidene chloride and vinyl fluoride; and α,β-unsaturated aromatic hydrocarbon such as styrene, α-methylstyrene and sodium styrenesulfonate.

An amount of use of the monomer having the oxazoline group in the copolymer is not particularly limited, but is preferably 5% by mass or more, further preferably 5 to 90% by mass, still further preferably 10 to 80% by mass, and particularly preferably 30 to 60% by mass, based on a total monomer.

As the oxazoline compound, a compound obtained by synthesis by a conventionally known method may be used, or a commercial item may be used.

Specific examples of the commercial item of the polymer having the oxazoline group include EPOCROS K series, EPOCROS WS series and EPOCROS RPS, respectively, made by Nippon Shokubai Co., Ltd., and specific examples thereof include EPOCROS WS-500 and EPOCROS RPS-1005. Moreover, specific examples of the commercial item of the low-molecular-weight compound having the oxazoline group include 2,2'-(1,3-phenylene)bis(2-oxazoline) made by Mikuni Pharmaceutical Industrial Co., Ltd.

A content of the oxazoline compound is preferably 0.02 to 1 part by mass based on 1 part by mass of the polyvinyl acetal resin in view of capability of obtaining the adhesive layer well-balanced and excellent in the adhesive properties with the adherend, particularly, the adhesive properties and the heat resistance under the high temperature, and further preferably 0.05 to 0.5 part by mass in view of capability of obtaining the adhesive layer well-balanced and excellent in the adhesive properties with the adherend, particularly, the adhesive properties, the heat resistance and the heat dissipation characteristics under the high temperature, and in consideration of the storage stability when the composition according to the invention is applied as one-component type.

The oxazoline compound may be used alone, or two or more kinds thereof may be used.

Solvent

The composition according to the invention may contain a solvent or needs not contain a solvent, but preferably contains a solvent in view of ease of formation of the adhesive layer, or the like. The solvent is preferably a solvent that can dissolve the polyvinyl acetal resin and the oxazoline compound therein. Specific examples of such a solvent include: an alcoholic solvent such as methanol, ethanol, n-propanol, iso-propanol, 1-methoxy-2-propanol, n-butanol, sec-butanol, n-octanol, diacetone alcohol and benzyl alcohol; a cellosolve-type solvent such as methyl cellosolve, ethyl cellosolve and butyl cellosolve; a ketone solvent such as acetone, methyl ethyl ketone, cyclopentanone, cyclohexanone and isophorone; an amide solvent such as N,N-dimethylacetamide, N,N-dimethylformamide and 1-methyl-2-pyrrolidone; an ester-type solvent such as methyl acetate and ethyl acetate; an ether-type solvent such as dioxane and tetrahydrofuran; a chlorinated hydrocarbon-type solvent such as methylene chloride and chloroform; an aromatic solvent such as toluene and pyridine; an organic solvent such as dimethyl sulfoxide, acetic acid, terpineol, butylcarbitol and butylcarbitol acetate; and water.

The above solvents may be used alone, or two or more kinds thereof may be used.

The solvent is used to be in an amount of preferably 500 to 5000 parts by mass, and further preferably 700 to 1,500 parts by mass, based on 100 parts by mass of the polyvinyl acetal resin in the composition, and is used to be in an amount of preferably 1000 to 500,000 parts by mass, and further preferably 2,800 to 60,000 parts by mass, based on 100 parts by mass of the oxazoline compound in the composition, in view of capability of obtaining the composition that is hard to form a precipitate or the like and is excellent in the storage stability.

Additive

An additive such as a stabilizer and a modifier may be added to the composition according to the invention in the range in which such an additive is ordinarily used. Moreover, as such an additive, a commercially available additive can be used. Moreover, other resins can also be added to the composition according to the invention in the range in which the characteristics of the polyvinyl acetal resin are not adversely affected.

The above additives may be used alone, or two or more kinds thereof may be used.

As the additive, for example, when the resin that forms the adhesive layer is deteriorated by contact with metal, addition of a copper inhibitor or a metal deactivator as described in JP H5-48265 A is preferred, and when the composition according to the invention contains a thermally conductive filler, addition of a silane coupling agent is preferred in order to improve adhesiveness between the thermally conductive filler and the polyvinyl acetal resin.

As the silane coupling agent, a silane coupling agent made by JNC Corporation (tradenames; S330, S510, S520, S530) or the like is preferred.

An amount of addition of the silane coupling agent is preferably 1 to 10 parts by mass, based on a total amount of 100 pasts by mass of the resin contained in the composition according to the invention in view of capability of improving the adhesive properties with the metal sheet, or the like.

The polyvinyl acetal resin described above has been used for an enameled wire for many years, and is hard to be deteriorated or deteriorate the metal by contact with the metal. However, when the adhesive layer obtained from the composition according to the invention is used for an apparatus used in an environment of high temperature and high humidity, the copper inhibitor or the metal deactivator may be added to the composition.

As the copper inhibitor (tradename), Mark ZS-27 and Mark CDA-16 made by ADEKA Corporation, SANKO-EPOCLEAN made by Sanko Chemical Industry Co., Ltd., Irganox MD1024 made by BASF SE and so forth are preferred.

An amount of addition of the copper inhibitor is preferably 0.1 to 3 parts by mass based on 100 parts by mass of a total amount of the resin contained in the composition according to the invention in view of capability of preventing deterioration of a resin in a part of the adhesive layer in contact with metal.

Thermally Conductive Filler

The composition according to the invention may contain a small amount of thermally conductive filler for the purpose of improving thermal conductivity. However, a large amount of addition of the thermally conductive filler has a possibility of reducing adhesion performance, and therefore attention is required to be paid to a balance between the amount of addition thereof and the adhesion performance upon adding the filler.

The thermally conductive filler is not particularly limited, and specific examples thereof include a metal or metallic compound-containing filler such as metal powder, metal oxide powder, metal nitride powder, metal hydroxide powder, metal oxynitride powder and metal carbide powder, and a carbon material-containing filler.

The above thermally conductive fillers may be used alone, or two or more kinds thereof may be used.

As the thermally conductive filler, a commercial item having a mean diameter and a shape in a desired range may be directly used, or a filler obtained by milling, classifying, heating or the like of the commercial item in such a manner that the mean diameter and the shape are fallen within the desired range may be used.

A preferred blending amount of the thermally conductive filler is 1 to 20% by mass based on 100% by mass of the composition according to the invention.

Method of Preparing the Composition for Forming the Adhesive Layer

The composition according to the invention can be obtained by mixing the polyvinyl acetal resin and the oxazoline compound, and when necessary, the solvent and the additive.

When the composition according to the invention is a one-part type composition, the composition is preferably a one-part composition prepared by dissolving the polyvinyl acetal resin and the oxazoline compound in the solvent (containing the additive, when necessary). When the composition according to the invention is a two-component type composition, the composition is preferably a two-part type composition of one part prepared by dissolving the polyvinyl acetal resin in the solvent, and one part prepared by dissolving the oxazoline compound in the solvent (containing the additive, when necessary). In the case of the two-part type composition, the additive to be blended when necessary may be blended to one part or the other one part, or may be blended both parts.

Adhesive Layer

The adhesive layer according to the invention is a layer obtained by using the polyvinyl acetal resin and the oxazoline compound, or a layer obtained by using the composition according to the invention.

Such an adhesive layer is excellent in the adhesive properties with the adherend, particularly, the metallic material such as the metal sheet, or the carbon material such as the graphite sheet, even under the high temperature, specifically, under a temperature of about 120° C. or higher, or even when a thickness thereof is small. Thus, the heat dissipation member, and further an electronic device, a battery, a capacitor, an automobile component and a machine mechanism component that are excellent in the heat resistance, durability and heat dissipation characteristics and can achieve weight reduction and size reduction can be obtained by using such an adhesive layer.

A thickness of the adhesive layer is preferably as small as possible if the adhesive layer has a thickness at which the adherend can be adhered thereon in view of capability of reducing heat resistance, or the like, and preferably 30 micrometers or less, further preferably 10 micrometers or less, and particularly preferably 5 micrometers or less.

The adhesive layer according to the invention includes the polyvinyl acetal resin and the oxazoline compound, and therefore can be adhered onto the adherend, particularly, the metallic material such as the metal sheet, or the carbon material such as the graphite sheet, even when the thickness of the adhesive layer is 1 micrometer or less.

Manufacturing Method for the Adhesive Layer

The manufacturing method for the adhesive layer according to the invention is not particularly limited, but a manufacturing method including steps (1) and (2) described below is preferred.

Step (1): a step of forming a layer including a polyvinyl acetal resin and an oxazoline compound Step (2): a step of heating the layer obtained in step (1)

Step (1)

Step (1) is the step of forming the layer including the polyvinyl acetal resin and the oxazoline compound.

In step (1), the composition according to the invention, particularly, the one-part type composition or the two-part type composition is preferably used.

Specific examples of step (1) include a step of applying the one-part type composition or the two-part type composition by a conventionally known method, and performing preliminary drying when necessary to form the layer including the polyvinyl acetal resin and the oxazoline compound.

In addition, when the two-part type composition is used, two parts may be preliminary mixed and then the resulting mixture may be applied onto the adherend, or one part may be applied onto the adherend and then another part may be applied thereonto. In a latter case, one part may be applied onto the adherend, followed by performing preliminary drying, and then another part may be applied thereonto. However, in view of capability of obtaining the adhesive layer excellent in the adhesive properties and the heat resistance under the high temperature, or the like, one part is applied onto the adherend, and then another part liquid is preferably applied thereonto before the one part is dried.

Moreover, when the one-part type composition is used, or the two-part type composition obtained by preliminary mixing two parts is used, the adherend may be immersed into the composition, and the preliminary drying may be performed when necessary to form the layer including the polyvinyl acetal resin and the oxazoline compound.

Conditions of the preliminary drying are not particularly limited, and may be appropriately selected according to the composition to be used, but a preliminary drying temperature is 60 to 120° C. and a drying time is about 1 to 30 minutes, for example.

Step (2)

Step (2) is the step of heating the layer obtained in step (1). The adhesive layer is obtained according to the step.

A heating temperature in step (2) is, although a level depends on a heat-resistance temperature of the adherend, or the like, preferably 150 to 250° C., and further preferably 170 to 220° C. in view of capability of obtaining the adhesive layer excellent in the adhesive properties under the high temperature, and particularly preferably 200 to 220° C. in view of capability of obtaining the adhesive layer superb in the heat resistance.

Moreover, a heating time in step (2) is, although a level depends on a thickness of the adherend, or the like, preferably 0.1 to 30 minutes, and further preferably 0.1 to 20 minutes in view of capability of obtaining the adhesive layer excellent in the adhesive properties, and for example, when the thickness of the adhesive layer according to the invention is within the range described above, particularly preferably 1 to 3 minutes in view of capability of obtaining the adhesive layer superb in the heat resistance with high economic efficiency, or the like. According to the invention, even by heating the layer for such a short period of time, the adhesive layer excellent in the adhesive properties and further the adhesive properties under the high temperature can be obtained, and the adhesive layer excellent in the heat resistance can be obtained. Therefore, a member including the adhesive layer can be formed with high productivity and economic efficiency.

In step (2), the layer is preferably heated while being pressurized in view of improvement in adhesive strength with the adherend, or the like. A pressure on the above occasion is not particularly limited, but is 5 to 100 MPa, for example.

Composite Material

The composite material according to the invention is a composite material formed by adhering, to each other, one kind of carbon material selected from the group of a graphite sheet, a carbon fiber, a carbon nanotube and diamond, or at least two kinds of carbon materials selected from the group, through the adhesive layer.

Specific examples of the composite material formed by adhering, to each other, one kind of carbon material through the adhesive layer include, when a graphite sheet is used as the carbon material, a laminate formed by adhering, to each other, at least two graphite sheets through the adhesive layer. In addition, in the above case, at least two graphite sheets may be identical sheets, or may be sheets different in a thickness, a shape, material quality or the like.

Moreover, when the carbon fiber is used as the carbon material, the adhesive layer may exist only on adhesion surfaces of at least two fibers, and may exist wholly on outer surfaces of at least two fibers or wholly on inner and outer surfaces thereof. Specific examples of the composite material in which the adhesive layer exits wholly on the outer surfaces or wholly on the inner and outer surfaces of at least two fibers include a composite material in which at least two fibers are dispersed into the adhesive layer. In addition, at least two fibers described above may be identical fibers, or may be fibers different in a shape, material quality or the like. A case where the carbon nanotube or diamond is used as the carbon material is also similar to the case where the carbon fiber is used.

Specific examples of the composite material formed by adhering, to each other, at least two kinds of carbon materials include, when a carbon fiber, a carbon nanotube or diamond (hereinafter, also referred to as "carbon fiber or the like," and a graphite sheet are used as the carbon material, a laminate in which the graphite sheet and the carbon fiber or the like are adhered through the adhesive layer, a laminate in which the adhesive layer onto which the carbon fiber or the like is dispersed is laminated on the graphite sheet, and a laminate in which at least two graphite sheets are adhered, to each other, through the adhesive layer onto which the carbon fiber or the like is dispersed. In addition, when at least two graphite sheets are included in the composite material obtained, the sheets may be identical sheets, or may be sheets different in a thickness, a shape, material quality or the like. A same rule applies also to the carbon fiber or the like.

The adhesive layer according to the invention is excellent in the adhesive properties, particularly the adhesive properties at the high temperature between the graphite sheets, and therefore as the composite material according to the invention, the composite material containing at least two graphite sheets is preferred. The graphite sheet has large thermal conductivity, and is light in weight and rich in flexibility. Accordingly, the composite material being excellent in the heat dissipation characteristics, and light in weight can be obtained by using such a graphite sheet. Therefore, the composite material is preferably used as the heat dissipation member, and is particularly preferably used as the heat dissipation member for a heating unit a temperature of which becomes high.

Graphite Sheet

The graphite sheet is not particularly limited if a sheet composed of graphite is applied thereto, but for example, a sheet manufactured by the method described in JP S61-275117 A and JP H11-21117 A each may be used, or a commercial item may be used.

Specific examples of the commercial item, as an artificial graphite sheet (tradename) manufactured from a synthetic resin sheet, include eGRAF SPREADERSHIELD SS-1500 (made by GrafTECH International Holdings Inc.), Graphinity (made by KANEKA Corporation) and a PGS graphite sheet (made by Panasonic Corporation), and as a natural graphite sheet (tradename) manufactured from natural graphite, include eGRAF SPREADERSHIELD SS-500 (made by GrafTECH International Holdings Inc.).

In-plane thermal conductivity of the graphite sheet is preferably 250 to 2000 W/m K, and further preferably 500 to 2000 W/m·K. When the thermal conductivity of the graphite sheet is in the range described above, the composite material (heat dissipation member) excellent in the heat dissipation characteristics, soaking properties or the like can be obtained.

The thermal conductivity can be calculated by measuring thermal diffusivity, specific heat and density by a laser flash or xenon flash thermal-diffusivity measuring instrument, DSC and an Archimedes method, respectively, and multiplying the measured values with each other.

A thickness of the graphite sheet is not particularly limited.

In order to obtain the composite material (heat dissipation member) excellent in the heat dissipation characteristics, the graphite sheet is preferably in a thick layer. The thickness thereof is preferably 15 to 600 micrometers, further preferably 15 to 500 micrometers, and particularly preferably 15 to 300 micrometers.

In addition, the graphite sheet may be a sheet having a hole or a slit provided in a part thereof.

Sheet

The sheet according to the invention is a sheet formed by adhering, to each other, at least one kind of carbon material selected from the group of the graphite sheet, the carbon fiber, the carbon nanotube and the diamond to the metal sheet through the adhesive layer.

Specific examples of the above sheet include a laminate in which the graphite sheet and the metal sheet are adhered through the adhesive layer, a laminate in which the adhesive layer into which the carbon fiber or the like is dispersed is laminated on the graphite sheet, a laminate in which at least two graphite sheets are adhered, to each other, through the adhesive layer into which the carbon fiber or the like is dispersed, and a laminate in which the graphite sheet and the metal sheet are adhered through the adhesive layer into which the carbon fiber or the like is dispersed. In addition, in the above case, when at least two material sheets are included in the sheets obtained, the sheets may be identical sheets, or may be sheets different in a thickness, a shape, material quality or the like. A same rule applies also to the carbon material.

The adhesive layer according to the invention is excellent in the adhesive properties with the metal sheet and the graphite sheet, particularly the adhesive properties at the high temperature, and therefore the sheet according to the invention is preferably the sheet including the graphite sheet, and particularly preferably the sheet in which the metal sheet, the adhesive sheet, the graphite sheet, the adhesive sheet and the metal sheet are laminated in the above order. Such a sheet is excellent in the heat dissipation characteristics while being light in weight, and therefore is preferably used as the heat dissipation member, and is particularly preferably used as the heat dissipation member of the heating unit the temperature of which becomes high. Moreover, the sheet in which the metal sheet, the adhesive sheet, the graphite sheet, the adhesive sheet and the metal sheet are laminated in the above order has high adhesive strength between the metal sheet and the graphite sheet and excellent in processability and bending properties, and therefore is preferred.

A thickness of the sheet according to the invention is not particularly limited, and a thickness of the adhesive layer may be comparable to the thickness specified in the section of the adhesive layer, and when the graphite is used as the carbon material, may be comparable to the thickness specified in the section of the graphite sheet, and a thickness of the metal sheet may be comparable to the thickness specified in the section of the metal sheet. A total thickness of the above layers used depending on a configuration of the laminate corresponds to the thickness of the sheet according to the invention.

Specifically, the thickness of the sheet according to the invention is preferably 10 to 300 micrometers, and further preferably 15 to 150 micrometers.

Metal Sheet

Thermal capacity, mechanical strength, processability or the like of the sheet according to the invention is improved by using the metal sheet.

Specific examples of the metal sheet include preferably a sheet including metal excellent in thermal conductivity, further preferably a sheet including gold, silver, copper, aluminum, nickel, and alloy containing at least any one thereof, still further preferable a sheet including silver, copper, aluminum, nickel, and alloy containing at least any one thereof, and particularly preferably a sheet including at least one kind of metal selected from the group of copper, aluminum and alloy containing at least any one thereof.

The alloy may be in any state of a solid solution, a eutectic or an intermetallic compound.

Specific examples of the alloy include phosphor bronze, copper nickel and duralumin.

A thickness of the metal sheet is not particularly limited, and may be appropriately selected in consideration of an application, weight, thermal conductivity or the like of the sheet according to the invention to be obtained, but is preferably 5 to 1000 micrometers, further preferably 10 to 50 micrometers, and particularly preferably 12 to 40 micrometers in view of ease of availability or the like. Moreover, the thickness of the metal sheet is preferably 0.01 to 100 times the thickness of the graphite sheet, and further preferably 0.1 to 10 times the thickness thereof in view of capability of obtaining the sheet (heat dissipation member) according to the invention excellent in the heat dissipation characteristics.

Heat Dissipation Member

The heat dissipation member according to the invention includes at least one selected from the composite material and the sheet according to the invention.

A shape of such a heat dissipation member is not particularly limited, and may be appropriately selected according to a desired application, but for example, may be a shape obtained by folding the sheet according to the invention into a bellows shape for the purpose of obtaining the heat dissipation member excellent in the heat dissipation characteristics.

The heat dissipation member according to the invention is preferably a sheet in which the metal sheet, the adhesive sheet, the graphite sheet, the adhesive sheet and the metal sheet are laminated in the above order. Such a sheet is excellent in the heat dissipation characteristics while being light in weight, and therefore is preferably used as the heat dissipation member, and is particularly preferably used as the heat dissipation member of the heating unit the temperature of which becomes high.

Electronic Device, Battery, Capacitor, Automobile Component and Machine Mechanism Component The electronic device, the battery, the capacitor, the automobile component and the machine mechanism component according to the invention include at least one selected from the composite material, the sheet and the heat dissipation member according to the invention.

Specifically, the composite material, the sheet or the heat dissipation member according to the invention is arranged and used so as to be in contact with the heating unit thereamong in the electronic device, the battery, the capacitor, the automobile component or the machine mechanism component.

In addition, an expression "in contact with the heating unit" includes a case where the composite material, the sheet or the heat dissipation member according to the invention is in direct contact with the heating unit, and also a case where the composite material, the sheet or the heat dissipation member according to the invention is in contact with the heating unit through a conventionally known layer such as the adhesive layer.

Electronic Device

Specific examples of the electronic device include a chip such as an ASIC (Application Specific Integrated Circuit) used for image processing, a television, an audio or the like, a CPU (Central Processing Unit) of a personal computer, a smart phone or the like, an IGBT, and LED illumination.

Battery

Specific examples of the battery include a rechargeable lithium-ion battery, a nickel-hydrogen battery and a multivalent ion secondary battery used for an automobile, and a cellular phone (for example, a smartphone).

Capacitor

Specific examples of the capacitor include a polyacene capacitor and a lithium ion capacitor used for an automobile or a cellular phone (for example, a smart phone).

The lithium ion capacitor may be a module in which a plurality of lithium ion capacitor cells are connected in series or in parallel.

In the above case, the composite material, the sheet or the heat dissipation member according to the invention may be arranged so as to be in contact with a part of an outer surface of the module as a whole or so as to cover the module as a whole, or so as to be in contact with a part of an outer surface of each lithium ion capacitor cell or so as to cover each cell.

Automobile Component or Machine Mechanism Component

Specific examples of the automobile component or the machine mechanism component include an ECU (Electronic Control Unit), a car navigation system, a power controller and a soaking heater.

EXAMPLES

The invention will be described in detail using Examples described below. However, the invention is not limited to a content described in Examples below.

Materials used in Examples of the invention are as described below.

Polyvinyl Acetal Resin
"PVF-C": Vinylec C (tradename): made by JNC Corporation, a polyvinyl formal resin (weight average molecular weight: 64,000, including constitutional unit D described above)
"PVF-K": Vinylec K (tradename): made by JNC Corporation, a polyvinyl formal resin (weight average molecular weight: 45,000; including constitutional unit D described above)
"DENKABUTYRAL": made by Denka Company Limited, a polyvinyl butyral resin (including no constitutional unit D described)

Oxazoline Compound
"RPS-1005": EPOCROS RPS-1005 (tradename): made by Nippon Shokubai Co., Ltd., an oxazoline group-containing polymer
"WS-500": EPOCROS WS-500 (tradename): made by Nippon Shokubai Co., Ltd., an oxazoline group-containing polymer (nonvolatile content: 39%)
"1,3-BPO": 2,2'-(1,3-phenylene)bis(2-oxazoline): made by Mikuni Pharmaceutical Industrial Co., Ltd.

Solvent
"NMP": 1-methyl-2-pyrrolidone: made by Wako Pure Chemical Industries, Ltd., Wako guaranteed reagent Graphite Sheet
Graphite sheet (artificial graphite): made by GrafTECH International Holdings Inc., SS-1500 (tradename), thickness: 25 mm, in-plane thermal conductivity of a sheet: 1500 W/m·K Metal Plate
Copper plate: made by The Nilaco Corporation, a thickness: 0.02 mm Example 1

An adhesive (composition) was obtained by stirring PVF-C (2 g), RPS-1005 (0.1 g) and 20 g of NMP at room temperature overnight, and completely dissolving PVF-C and RPS-1005 in NMP.

Preparation of a Composite Sheet

A copper plate with an adhesive coating was obtained by applying the adhesive onto a 0.02 mm-thick copper plate having a size of 50×50 mm to be about 5 μm in a thickness of an adhesive layer by using a spin coater (made by MIKASA Co., Ltd., 1H-D3 type) under conditions of 1500 rpm, and then performing preliminary drying on a hot plate set to 80° C. for 10 minutes.

In addition, in order to eliminate an effect of unevenness of the copper plate and the graphite sheet to accurately evaluate the adhesive layer in the experiment, the thickness of the adhesive layer was adjusted to 5 μm.

A 25 μm-thick graphite sheet (SS-1500) previously cut into a size of 60×60 mm was interposed by the two copper plates with the adhesive coating with a side of the adhesive coating facing inward, and a resulting material was placed stationarily on a hot plate of a mini hot press (mini test press-10 type mini manual hot press; made by Toyo Seiki Seisaku-sho, Ltd.). The adhesive coating was degasified by repeating pressurization and depressurization several times while attention was paid in such a manner that each position of the two copper plates and the graphite sheet is fixed in a predetermined place, and then pressurization was performed to be 10 MPa. Then, a heater was heated to 170° C. (heating temperature during forming the adhesive layer) and the temperature and the pressure were retained for 10 minutes (heating time during forming the adhesive layer). After 10 minutes, the heater was turned off, and was cooled to be about 25° C. A composite sheet was obtained by stopping the pressurization after cooling.

In addition, a thickness of the composite sheet was measured, and ½ of a value obtained by subtracting a thickness of the adhesive layer and the two copper plates from the measured value was taken as a thickness of the adhesive layer. The thickness of the composite sheet was measured by Digimatic Indicator ID-C112CXB made by Mitutoyo Corporation.

Evaluation of High-Temperature Adhesive Properties

The graphite layer has characteristics of causing cleavage (peeled inside the layer), and therefore adhesive strength between the metal layer (copper plate) and the graphite layer (graphite sheet) of the composite sheet obtained is hard to determine by a numerical value of a tensile load or the like upon pealing the layers.

Accordingly, high-temperature adhesive properties of the adhesive layer were evaluated by placing the composite sheet obtained on a hot plate heated to 120° C., pealing a metal part of the composite sheet under a temperature of 120° C., and then visually observing a state of an inner surface of the metal layer after pealing the part. A case where a surface as a whole of the metal layer peeled was covered with cleaved graphite was deemed to be "good," and a case where the metal layer or the adhesive layer was exposed was deemed to be "poor." Then, an evaluation was made, on a sample deemed to be "good" in visual observation, by measuring an infrared absorption spectrum on a pealed surface after pealing the part by using iS10-type ATR Adaptor made by Thermo Fisher Scientific K.K., and then observing, from the spectrum, whether or not a polyvinyl acetal resin existed on the peeled surface. A case where no polyvinyl acetal resin existed on the peeled surface was deemed to be "excellent," and a case where the polyvinyl acetal resin existed on the peeled surface was deemed to be "poor." More specifically, a case where the metal layer or the adhesive layer (polyvinyl acetal resin) was unable to be observed wholly on the surface of the metal layer peeled in both the visual observation and the infrared absorption spectrum evaluation is expressed as "excellent" in Table 1, and a case where a sample was deemed to be "poor" in either the visual observation or the infrared absorption spectrum evaluation is expressed as "poor" in Table 1.

Evaluation of Heat Resistance

A shape of the composite sheet was visually confirmed by placing the composite sheet obtained, for 10 seconds, on a hot plate heated to 110° C., 120° C., 130° C., 140° C., 150° C., 160° C., 170° C., 180° C., 190° C., 200° C. or 210° C. The test was conducted by using the same composite sheet at each temperature sequentially from 110° C. until swelling was caused in the composite sheet. A temperature at which the shape of the composite sheet was kept in a shape during preparation of the composite sheet, and the temperature immediately before swelling was caused is shown in Table 1.

In addition, the heating time was adjusted to 10 seconds in the above test for convenience, but when no change was caused in the shape of the composite sheet by heating the sample for 10 minutes in a predetermined test, no change was confirmed to be caused in the shape of the composite sheet even by heating for 2 hours or more. Accordingly, the composite sheet that can withstand heating for 10 seconds can be reasonably described to have resistance at the heating temperature.

Examples 2 to 19

A composite sheet was prepared in a manner similar to Example 1 except that a kind of resin, a kind or an amount of addition of oxazoline compound, or a heating temperature or a heating time during forming an adhesive layer were changed as shown in Table 1, and high-temperature adhesive properties and heat resistance were evaluated by using the composite sheet in a manner similar to Example 1.

Comparative Example 1

A composite sheet was prepared in a manner similar to Example 3 except that no oxazoline compound was used, and high-temperature adhesive properties and heat resistance were evaluated by using the composite sheet in a manner similar to Example 1.

TABLE 1

| Test name | Resin | Oxazoline compound Kind | Blending amount (g) | During forming adhesive layer Heating temperature (° C.) | Heating time (min) | High-temperature adhesive properties | Heat resistance (° C.) | Remark |
|---|---|---|---|---|---|---|---|---|
| Example 1 | PVF-C | RPS-1005 | 0.1 | 170 | 10 | Excellent | 140 | |
| Example 2 | PVF-C | RPS-1005 | 0.1 | 190 | 10 | Excellent | 150 | |
| Example 3 | PVF-C | RPS-1005 | 0.1 | 220 | 10 | Excellent | 150 | |
| Example 4 | PVF-C | RPS-1005 | 0.2 | 220 | 10 | Excellent | 150 | |
| Example 5 | PVF-C | RPS-1005 | 0.4 | 220 | 10 | Excellent | 160 | |
| Example 6 | PVF-C | WS-500 | 0.25 | 170 | 10 | Excellent | 140 | |
| Example 7 | PVF-C | WS-500 | 0.25 | 190 | 10 | Excellent | 140 | |
| Example 8 | PVF-C | WS-500 | 0.25 | 220 | 10 | Excellent | 150 | |
| Example 9 | PVF-C | WS-500 | 0.5 | 220 | 10 | Excellent | 150 | |
| Example 10 | PVF-C | WS-500 | 1 | 220 | 10 | Excellent | 160 | |
| Comparative Example 1 | PVF-C | — | — | 220 | 10 | Poor | 140 | |
| Example 11 | PVF-C | RPS-1005 | 0.4 | 220 | 0.16 | Excellent | 150 | |
| Example 12 | PVF-C | RPS-1005 | 0.4 | 220 | 2 | Excellent | 200 | |
| Example 13 | PVF-C | RPS-1005 | 0.4 | 220 | 20 | Excellent | 160 | |
| Example 14 | PVF-C | RPS-1005 | 1 | 220 | 2 | Excellent | 180 | |
| Example 15 | PVF-C | RPS-1005 | 1.5 | 220 | 2 | Excellent | 180 | |
| Example 16 | PVF-C | RPS-1005 | 2 | 220 | 2 | Excellent | 180 | |
| Example 17 | PVF-C | 1,3-BPO | 0.2 | 220 | 2 | Excellent | 150 | |
| Example 18 | DENKA BUTYRAL | RPS-1005 | 0.4 | 220 | 2 | Excellent | 150 | |
| Example 19 | PVF-K | RPS-1005 | 0.4 | 220 | 2 | Excellent | 170 | |
| Example 20 | PVF-C | RPS-1005 | 0.4 | 220 | 2 | Excellent | 200 | * two-part |

Example 20

A PVE solution in which PVF-C (2 g) was dissolved in 20 g of NMP, and an RPS solution in which RPS-1005 (0.4 g) was dissolved in 5 g of NMP were prepared.

First, the RPS solution was applied onto a 0.02 mm-thick copper plate having a size of 50×50 mm by using a spin coater (1H-D3 type) under conditions of 1500 rpm. Then, in a state in which an applied surface of the RPS solution was not yet dried, the PVF solution was applied onto the applied surface by using a spin coater (1H-D3 type) under conditions of 1500 rpm. Then, a copper plate with an adhesive coating was obtained by performing preliminary drying of the resulting copper plate on a hot plate set to 80° C. for 10 minutes.

A composite sheet (thickness of an adhesive layer: about 5 μm) was prepared in a manner similar to Example 12 except that the copper plate with the adhesive coating obtained was used, and high-temperature adhesive properties and heat resistance were evaluated by using the composite sheet in a manner similar to Example 1.

Example 21

Preparation of a Composite Sheet

A graphite sheet with an adhesive coating was obtained by applying the adhesive obtained in Example 5 onto a 25 μm-thick graphite sheet (SS-1500) having a size of 60×60 mm to be about 5 μm in a thickness of an adhesive layer by using a spin coater (1H-D3 type) under conditions of 3000 rpm, and then performing preliminary drying on a hot plate set to 80° C. for 10 minutes.

A 25 μm-thick graphite sheet (SS-1500) previously cut into a size of 60×60 mm was interposed by the two graphite sheets with the adhesive coating with a side of the adhesive coating facing inward, and a resulting material was placed stationarily on a hot plate of a mini hot press (mini test press-10 type mini manual hot press. The adhesive coating was degasified by repeating pressurization and depressurization several times while attention was paid in such a manner that each position of the two graphite sheets with the adhesive coatings, and the graphite sheet interposed by the two sheets is fixed in a predetermined place, and then pressurization was performed to be 10 MPa. Then, a heater was heated to 220° C. (heating temperature during forming the adhesive layer) and the temperature and the pressure were retained for 2 minutes (heating time during forming the adhesive layer). After 2 minutes, the heater was turned off, and was cooled to be about 25° C. A composite sheet was obtained by stopping the pressurization after cooling.

In addition, a thickness of the composite sheet was measured, and ½ of a value obtained by subtracting a thickness of three graphite sheets from the measured value was taken as a thickness of the adhesive layer. The thickness of the composite sheet was measured by Digimatic Indicator ID-C112CXB made by Mitutoyo Corporation.

Heat resistance was evaluated by using the composite sheet obtained in a manner similar to Example 1.

Evaluation of High-Temperature Adhesive Properties

The graphite layer has characteristics of causing cleavage (peeled inside the layer), and therefore adhesive strength between the graphite layers (graphite sheets) of the composite sheet obtained is hard to determine by a numerical value of a tensile load or the like upon pealing the layers.

Accordingly, high-temperature adhesive properties of the adhesive layer were evaluated by placing the composite sheet obtained on a hot plate heated to 120° C., then pealing a graphite part of the composite sheet under a temperature of 120° C., and then visually observing a state of an inner side surface of the graphite layer after being peeled. A case where a surface as a whole of the graphite layer peeled was covered only with cleaved graphite was deemed to be "good," and a case where the adhesive layer was exposed was deemed to be "poor." Then, an evaluation was made, on a sample deemed to be "good" in visual observation, by measuring an infrared absorption spectrum on a pealed surface after pealing the part by using iS10-type ATR Adaptor made by Thermo Fisher Scientific K.K., and then observing, from the spectrum, whether or not a polyvinyl acetal resin existed on the peeled surface. A case where no polyvinyl acetal resin existed on the peeled surface was deemed to be "excellent," and a case where the polyvinyl acetal resin existed on the peeled surface was deemed to be "poor." More specifically, a case where the adhesive layer (polyvinyl acetal resin) was unable to be observed wholly on the surface of the graphite layer peeled in both the visual observation and the infrared absorption spectrum evaluation is expressed as "excellent" in Table 2, and a case where a sample was deemed to be "poor" in either the visual observation or the infrared absorption spectrum evaluation is expressed as "poor" in Table 2.

Examples 22 and 23

A composite sheet was prepared in a manner similar to Example 21 except that a kind of resin, or a kind or an amount of addition of oxazoline compound were changed as shown in Table 2, in Example 21, and high-temperature adhesive properties and heat resistance were evaluated by using the composite sheet in a manner similar to Example 21.

Comparative Examples 2 and 3

A composite sheet was prepared in a manner similar to Example 21 except that no oxazoline compound was used in Example 21 and Example 23 each, and high-temperature adhesive properties and heat resistance were evaluated by using the composite sheet in a manner similar to Example 21.

TABLE 2

| Test name | Resin | Oxazoline compound Kind | Blending amount (g) | During forming adhesive layer Heating temperature (° C.) | Heating time (min) | High-temperature adhesive properties | Heat resistance (° C.) |
|---|---|---|---|---|---|---|---|
| Comparative Example 2 | PVF-C | — | — | 220 | 2 | Poor | 140 |
| Example 21 | PVF-C | RPS-1005 | 0.4 | 220 | 2 | Excellent | 180 |
| Example 22 | PVF-C | WS-500 | 1 | 220 | 2 | Excellent | 180 |
| Comparative Example 3 | PVF-K | — | — | 220 | 2 | Poor | 140 |
| Example 23 | PVF-K | RPS-1005 | 0.4 | 220 | 2 | Excellent | 150 |

As described above, the adhesive layer obtained by using the polyvinyl acetal resin and the compound having the oxazoline group is found to be excellent in the high-temperature adhesive properties with an adherend such as the metal layer and the graphite layer, particularly, between the metal layer and the graphite layer and between the graphite layers.

What is claimed is:

1. A composition for forming an adhesive layer, comprising a polyvinyl acetal resin and a compound having an oxazoline group, wherein the compound having the oxazoline group is contained in an amount of 0.1 to 1 part by mass based on 1 part by mass of the polyvinyl acetal resin, and
wherein the polyvinyl acetal resin comprises constitutional units A, B and C:

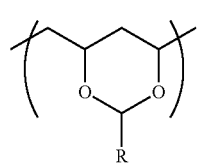

Constitutional unit A wherein, in constitutional unit A, R is independently hydrogen;

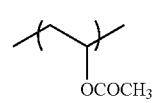

Constitutional unit B

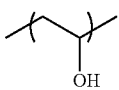 Constitutional unit C

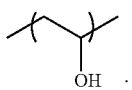 Constitutional unit C

2. The composition according to claim 1, wherein the polyvinyl acetal resin further comprises constitutional unit D:

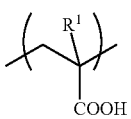 Constitutional unit D wherein, in constitutional unit D, $R^1$ is independently hydrogen or alkyl having 1 to 5 carbons.

3. An adhesive layer, obtained by using the composition according to claim 1.

4. An adhesive layer, obtained by using a polyvinyl acetal resin and a compound having an oxazoline group, wherein the compound having the oxazoline group is used in an amount of 0.1 to 1 part by mass based on 1 part by mass of the polyvinyl acetal resin, wherein the polyvinyl acetal resin comprises constitutional units A, B and C:

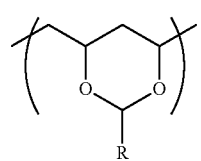 Constitutional unit A wherein, in constitutional unit A, R is independently hydrogen;

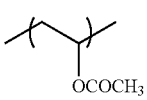 Constitutional unit B

5. A manufacturing method for the adhesive layer according to claim 4, comprising steps (1) and (2) below:
step (1): forming a layer comprising a polyvinyl acetal resin and a compound having an oxazoline group; and
step (2): heating the layer obtained in step (1).

6. A composite material, formed by adhering to each other, one kind of carbon material selected from the group of a graphite sheet, a carbon fiber, a carbon nanotube and diamond, or at least two kinds of carbon materials selected from the group, by using the adhesive layer according to claim 4.

7. A heat dissipation member, comprising the composite material according to claim 6.

8. An electronic device, comprising the composite material according to claim 6.

9. A battery, comprising the composite material according to claim 6.

10. A capacitor, comprising the composite material according to claim 6.

11. An automobile component, comprising the composite material according to claim 6.

12. A machine mechanism component, comprising the composite material according to claim 6.

13. A sheet, formed by adhering at least one kind of carbon material selected from the group of a graphite sheet, a carbon fiber, a carbon nanotube and diamond to a metal sheet by using the adhesive layer according to claim 4.

14. A heat dissipation member, comprising the sheet according to claim 13.

15. An electronic device, comprising the sheet according to claim 13.

16. A battery, comprising the sheet according to claim 13.

17. A capacitor, comprising the sheet according to claim 13.

* * * * *